United States Patent [19]

Hasegawa

[11] Patent Number: 5,406,162

[45] Date of Patent: Apr. 11, 1995

[54] ELECTROSTRICTIVE EFFECT ELEMENT AND METHOD OF PRODUCING THE SAME

[75] Inventor: Naozou Hasegawa, Tokyo, Japan

[73] Assignee: NEC Corporation, Tokyo, Japan

[21] Appl. No.: 835,383

[22] Filed: Feb. 14, 1992

[30] Foreign Application Priority Data

Feb. 20, 1991 [JP] Japan ............................ 3-25908

[51] Int. Cl.$^6$ ............................................. H01L 41/08
[52] U.S. Cl. ..................................... 310/328; 310/366
[58] Field of Search ................ 310/328, 344, 348, 366

[56] References Cited

U.S. PATENT DOCUMENTS

| | | | |
|---|---|---|---|
| 4,438,364 | 3/1984 | Morison | 310/328 |
| 4,460,842 | 7/1984 | Waanders et al. | 310/328 |
| 4,651,046 | 3/1987 | Ohya et al. | 310/328 |
| 4,781,477 | 11/1988 | Nagasawa | 310/328 |
| 4,995,587 | 2/1991 | Alexius | 310/328 |
| 5,004,945 | 4/1991 | Tomita et al. | 310/328 |
| 5,113,108 | 5/1992 | Yamashita et al. | 310/328 |
| 5,208,506 | 5/1993 | Yamashita | 310/328 |

FOREIGN PATENT DOCUMENTS 165381  7/1987  Japan ................................ 310/366

*Primary Examiner*—Thomas M. Dougherty
*Assistant Examiner*—C. LaBalle
*Attorney, Agent, or Firm*—Burns, Doane, Swecker & Mathis

[57] ABSTRACT

Disclosed is an electrostrictive effect element comprising a columnar casing having openings on either end, laminated blocks with a laminated ceramic capacitor structure. The laminated blocks are stacked in the casing and electrically connected to each other and have a sufficient number of electrostrictive material layers formed to prevent mechanically damaged due to stress generated when a voltage is applied. The electrostrictive effect also includes means which is disposed outside the casing and made of a spring or the like for applying a compressive force to said laminated blocks in the lamination direction thereof, and engaging members which are engaged with said laminated blocks for applying a compressive force through said compression means to said laminated blocks. The electrostrictive material layers of each laminated block are not damaged due to stress, and the adjacent laminated blocks are deformable at the contact surface thereof, so that stress generated in each laminated block can be dispersed at the contact surface with the adjacent one. It is preferable that the casing has a cross-sectional shape substantially equal to that of each laminated block and two windows on its side surfaces opposing to each other.

9 Claims, 6 Drawing Sheets

FIG.3
FIG.4
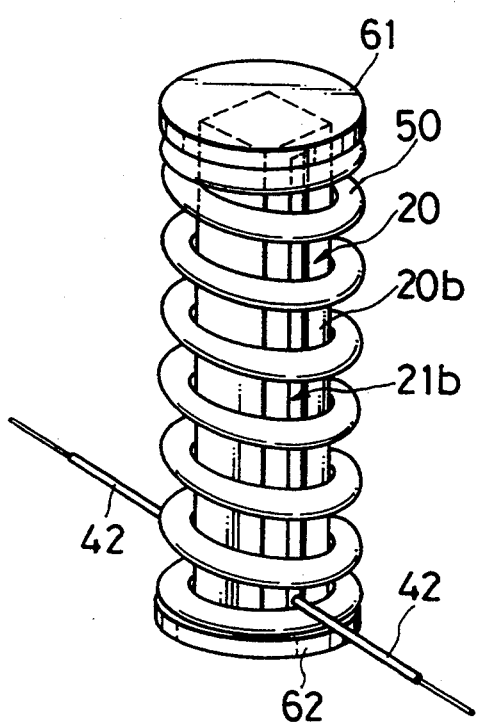
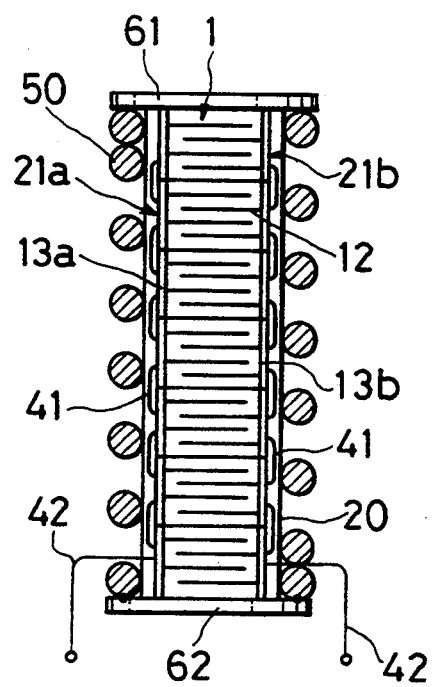

FIG.9
FIG.10
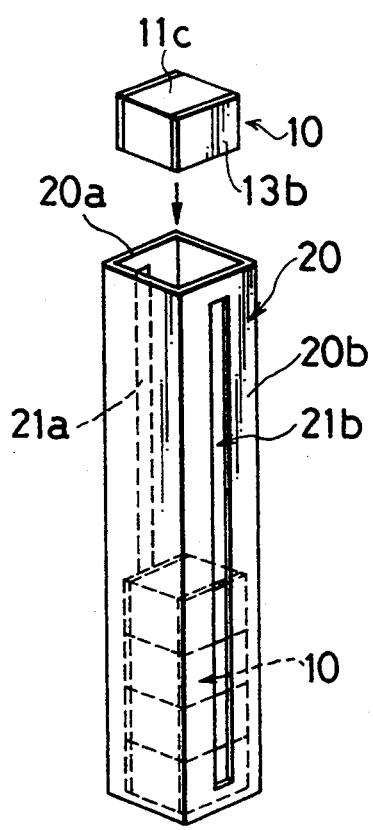
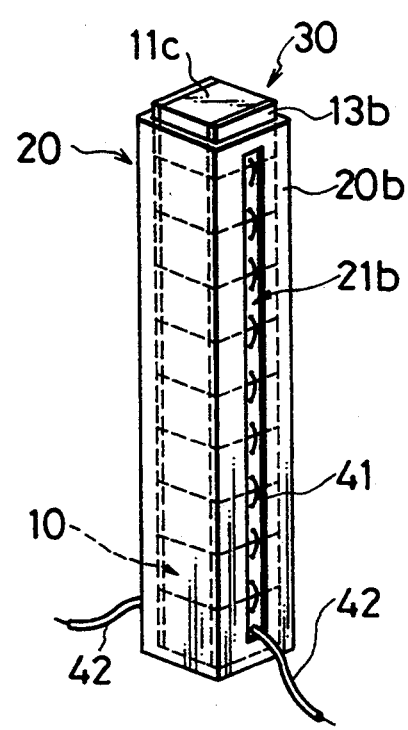

ELECTROSTRICTIVE EFFECT ELEMENT AND METHOD OF PRODUCING THE SAME

BACKGROUND OF THE INVENTION

1. Field of the Invention

This invention relates to an electrostrictive effect element for converting electric energy into mechanical energy using an electrostrictive effect of a solid, and a method of producing the same.

2. Description of the Prior Art

Electrostrictive effect elements have electrodes which are made of a metal film or the like and formed respectively on the opposing surfaces of an electrostrictive solid material and use an electrostrictive strain generated in the solid material when a voltage is applied across the electrodes thus formed. In this case, the electrostrictive strain generated in the electric field direction (longitudinal electrostrictive strain) is generally larger than the electrostrictive strain generated in the direction perpendicular to the electric field direction (transverse electrostrictive strain), so that the use of the former is higher in the energy conversion efficiency than that of the latter.

With the electrostrictive effect element using the transverse electrostrictive strain, when the size of the element in the direction perpendicular to the electric field direction is increased with an applied voltage kept constant, a displacement amount proportional thereto can be obtained. On the other hand with the electrostrictive effect element using the longitudinal electrostrictive strain, even when the size of the element in the electric field direction is increased with an applied voltage kept constant, the displacement amount cannot be increased because intensity of the electric field inside the element is decreased. The amount of strain to be generated, or the displacement amount, is proportional to the intensity of the electric field inside the element. As a result, in order to obtain a larger amount of displacement with an electrostrictive effect element utilizing the longitudinal electrostrictive effect, it is required to increase the intensity of the electric field inside the element. In this case, however, in order to increase the voltage to be applied, it is necessary to use a power source which is large and expensive, which is pointed out as a problem to be overcome with respect to the dangers of handling it.

Accordingly, previously, an electrostrictive effect element of an integrally laminated ceramic capacitor structure as shown in FIGS. 1 and 2 has been proposed. The electrostrictive effect element as discussed above comprises a laminated body 1 having a plurality of electrostrictive material layers laminated to form a columnar body having a rectangular cross-section, a plurality of plate-like internal electrodes 2a and a plurality of plate-like internal electrodes 2b respectively disposed in a evenly spaced manner in the longitudinal direction inside the laminated body 1, and external electrodes 3a and 3b provided respectively on the opposing side surfaces of the columnar laminated body 1. The internal electrodes 2a and 2b respectively are alternately disposed in the longitudinal direction of the laminated body 1. The internal electrodes 2a are electrically connected to the external electrode 3a, and the internal electrodes 2b are electrically connected to the external electrode 3b. As made clear from FIG. 2, the internal electrodes 2a and 2b are connected only to the corresponding one of the external electrodes 3a and 3b, and a superposed area 4 (rectangular area at the center of FIG. 2) of the internal electrodes 2a and 2b becomes small as compared with the cross-sectional area of this electrostrictive effect element. The space between the adjacent internal electrodes 2a and that between the adjacent internal electrodes 2b respectively can be made in an order of magnitude several tens microns ($\mu$m) by the conventional chip-type capacitor technology, so that the distance between the internal electrodes 2a and 2b adjacent to each other can be made small by introducing such a structure as shown in FIGS. 1 and 2. As a result, such an electrostrictive effect element can be practically realized that uses the longitudinal effect and can be driven by applying a low voltage.

However, there may arise the following problems on the conventional electrostrictive effect element shown in FIGS. 1 and 2:

When a voltage is applied across the external electrodes 3a and 3b, the superposed area 4 of the internal electrodes 2a and 2b is deformed in accordance with an intensity of the electric field due to strain generated in an electrostrictive material, and non-superposed areas 5a and 5b of the internal electrodes 2a and 2b and an area 6 not existing the internal electrodes 2a and 2b are not deformed, so that a stress concentration will form at their boundaries. Particularly, in case of an element having the internal electrodes 2a and 2b in a multi-layered structure, when a high voltage is applied for obtaining a larger displacement amount, the stress created will become large, making the element itself easily mechanically damaged.

Thus, an object of the present invention is to provide an electrostrictive effect element which is not mechanically damaged even when a high voltage is applied or when the internal electrodes thereof are formed in multiple layers, and its production method.

SUMMARY OF THE INVENTION

An electrostrictive effect element of this invention comprises a columnar casing having openings on its ends, a plurality of laminated blocks with a laminated ceramic capacitor structure which are superposingly contained in the casing and electrically connected to each other and have electrostrictive material layers formed in such a lamination number (for example, three to five layers) that the electrostrictive element is not mechanically damaged due to stress generated when a voltage is applied thereto, compression means which is disposed outside said casing and applies a compressive force in the direction of lamination to said laminated blocks, and engaging members which are engaged with said laminated blocks for applying a compressive force generated by said compression means to said laminated blocks. Each of said laminated blocks with a laminated ceramic capacitor structure comprises a laminated body having a plurality of electrostrictive material layers laminatedly formed, a plurality of first internal electrodes and a plurality of second internal electrodes which are disposed inside the laminated body in the direction of lamination, and a first external electrode and a second external electrode which are respectively disposed on the opposite side surfaces of the laminated body excepting the contact surfaces thereof with the adjacent ones. The first and second internal electrodes are alternately disposed inside said laminated body in the direction of lamination, and said first internal electrodes are electrically connected to said first external electrode and said second internal electrodes are electrically connected to said second external electrode. The first external electrodes of adjacent laminated blocks are electrically connected and the second external electrodes of adjacent laminated blocks are electrically connected to each other, thereby electrically connecting said plurality of laminated blocks to each other.

The laminated block of this invention has an electrostrictive material laminatedly formed in such a lamination number of layers that is not mechanically damaged due to stress generated when a voltage is applied to said electrostrictive material through said first and second external electrodes and first and second internal electrodes. A plurality of the laminated blocks are superposed in an one-by-one manner with no mechanical connection and retained while being applied with a compressive force in the lamination direction. As a result, the electrostrictive material layer of each laminated block is not damaged due to stress, and because the laminated blocks are disposed with no mechanical connection, adjacent ones are displaceable at the contact surface of them, which means that stress generated between the adjacent laminated blocks is dispersed at the contacting surface thereof. Accordingly, there is no concern that the electrostrictive effect element may be mechanically damaged as the whole, thus being capable of providing a displacement amount larger than that of a conventional one.

A production method of an electrostrictive effect element of this invention is such that laminated blocks each having a laminated capacitor type structure are prepared, then are superposingly contained into the columnar casing having openings on the either ends, and are electrically connected with each other. In addition, compression means is provided outside the casing, and engaging members are engaged with said laminated blocks to apply a compressive force through said compression means in the lamination direction of said laminated blocks.

In this invention, the columnar casing is preferable to be made of an electrically insulating synthetic resin, but can be made of a metal plate having an insulation film coating formed thereon or the like and other materials other than synthetic resin, if they are insulating. In addition, it is preferable to have the same cross-sectional shape as that of said laminated block as well as to have windows in the opposing side surfaces thereof correspondingly to said first and second external electrodes. This is because after superposingly containing said laminated blocks into said casing, these external electrodes can be connected by the lead wires through the windows from the outside of the casing, so that the design and production process of said casing and the connection of these lead wires can be performed easily. Further, in addition, said casing serves to guide said laminated blocks, and said casing does not need a compartment to house the lead wires or the like, resulting in a simple structure. In this case, however, it is possible that such a compartment that houses the lead wires or the like is formed in said casing, and after electrically connecting the external electrodes of said laminated blocks to each other, they are housed in the casing.

The lamination number of electrostrictive material layers to be provided into each laminated block should be such that the electrostrictive material layer is not damaged due to stress to be generated, which is different from the material to be used, it is preferable to have three to five layers laminated in general.

As the compressive force applying means to said laminated blocks, it is generally preferable to use a spiral-shaped tension spring from the viewpoint of volume efficiency, particularly preferable to use one that is similar in the cross-sectional shape to said casing, but not limited thereto. For example, a spiral-shaped compression spring or a plate spring also can be used therefor, and an elastic fabric material can be used to apply a tension to the either end plates thereof.

As the material of the engaging members to be engaged with said compression means, any material having such a rigidity that is not easily deformed due to the compressive action through said compression means can be used. The shape thereof is arbitrary, but a plate-like one, particularly, one that is similar in cross-sectional shape of the casing is preferable.

The superposition number of said laminated blocks are also arbitrary. As the electrostrictive material, any material can be used if it generates an electrostrictive effect.

The production method of said laminated block having a laminated capacitor structure is not limited specifically, and it is preferable to be produced in such a manner that a plate-like laminated body having a laminated capacitor structure is prepared, then cut in a desired size and shape to obtain a laminated body piece, and on the either cutting end surfaces thereof are formed external electrodes. So prepared that the external electrodes are exposed on these cutting end surfaces thereof. As a result, the direct formation of said external electrodes on the cutting end surfaces advantageously makes possible that said internal and external electrodes are automatically connected to each other.

BRIEF DESCRIPTION OF THE DRAWINGS

FIG. 3 is a perspective view of an electrostrictive effect element according to one embodiment of this invention.

FIG. 4 is a longitudinally cross-sectional view of the electrostrictive effect element shown in FIG. 3.

FIG. 9 is a perspective view showing the state that a plurality of laminated blocks shown in FIG. 8 are superposingly contained into a columnar casing having two windows formed respectively in the opposing side surfaces thereof.

FIG. 10 is a perspective view showing the state that a plurality of laminated blocks are superposingly contained into a columnar casing, then, adjacent first external electrodes are connected through lead wires to each other and adjacent second external electrodes are connected through lead wires to each other, and the lower-most first external electrode and lower-most second external electrode are connected to respective lead wires.

DESCRIPTION OF THE PREFERRED EMBODIMENTS

Preferred embodiments of this invention will be described below while referring to FIGS. 3 to 11.

Figure 7:
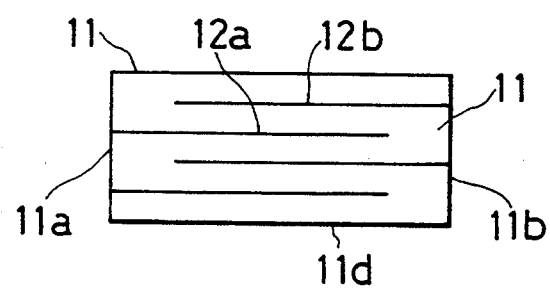
FIG. 7 is a longitudinally cross-sectional view of a laminated body piece obtained by cutting the ceramic green sheet-laminated body shown in FIGS. 5 and 6.
Figure 8:
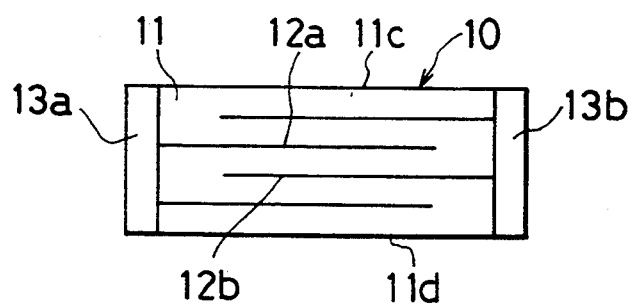
FIG. 8 is a longitudinally cross-sectional view of a laminated block obtained by forming external electrodes respectively on the opposing side surfaces of the laminated body piece shown in FIG. 7.

As shown in FIGS. 3 and 4, an electrostrictive effect element of this invention comprises a columnar casing 20 having a rectangular cross-sectional shape, a plurality of laminated blocks 10 superposingly disposed into the casing 20 (see FIG. 8), a tension spring 50 provided externally of the casing 20, two metal end plates 61 and 62 each disposed on the corresponding longitudinal (vertical) end of the casing and connected to the corresponding end of the tension spring 50. The laminated block 10 has a laminated layer ceramic capacitor structure similar to that of a conventional electronstrictive effect element except that it is smaller in height as compared with the conventional electrostrictive effect element already described above. That is, the laminated block 10 comprises, as shown in FIGS. 7 and 8, a laminated body 11 formed in a columnar shape having a rectangular cross-section shape by laminating a plurality of electrostrictive material sheets (five layers in FIGS. 7 and 8), a plurality of first internal electrode plates 12a and a plurality of second electrode plate 12b which are respectively disposed at a constant interval of space in the vertical direction inside the laminated body 11, and a first external electrode 13a and a second external electrode 13b respectively provided on a side surface 11a and a side surface 11b opposing to each other on the laminated body 11. The internal electrode 12a and 13a are disposed alternately in the vertical direction inside the laminated body 11, the first internal electrode 12a is electrically connected to the first external electrode 13a and the second internal electrode 12b is electrically connected to the second external electrode 13b. The external electrodes 13a and 13b are formed respectively on the entire surfaces of the side surfaces 11a and 11b of the laminated body 11. An upper surface 11c and a bottom surface 1*d* of the laminated body 11 both have no electrode formed, so that the electrostrictive material is exposed. In addition, the number of layers to be laminated in the laminated body 11 is set so as not to damage to the electrostrictive material due to stress concentration.

The casing 20 is formed of an electrically insulative synthetic resin, and has vertically extended windows 21a and 21b on its side surfaces 20a and 20b opposing to each other, respectively, and in addition, the either ends thereof are open. The windows 21a and 21b each is vertically extendedly formed in the casing 20 up to the vicinities of the upper end and lower end thereof, but not attained to the opening ends thereof. The cross-section of the casing 20 is made into a rectangular shape substantially equal to the shape of the laminated block 10 for ease of fit when the laminated block 10 is superposingly contained thereinto.

A plurality of the laminated blocks 10 structured as above (10 blocks in FIG. 10) are superposingly contained or stacked in the casing 20. The laminated blocks 10 except one that is disposed at the lower-most position of the casing 20 are merely placed in a successive manner with no mechanical connection to each other. The laminated block 10 disposed at the lower-most position thereof has a lower surface 11d exposed from the casing 20. The lower surface 11d thereof is contacted with the top surface 11c of the laminated block 10 placed just beneath. The laminated blocks 10 except those disposed at the lower-most and upper-most positions, respectively, have their lower surfaces 11d in contact with the upper surfaces 11c of the laminated blocks 10 placed just beneath, and their upper surfaces 11c in contact with the lower surfaces 11d of the laminated blocks 10 placed just above. In this case, the upper and lower surfaces of these laminated blocks 10 are substantially in complete contact. The upper surface of the upper-most laminated block 10 and the lower surface of the lower-most laminated block 10 slightly protrude from the upper end opening and lower end opening of the casing 20, respectively.

The first external electrodes 13a and the second external electrodes 13b of the adjacent laminated blocks 10 respectively are electrically connected in series by lead wires 41. The first external electrode 13a and second external electrode 13b of the lower-most laminated block 10 each has one end connected to a lead wire 42. As a result, a voltage is applied through these two lead wires 42, to simultaneously apply this voltage to the first external electrode 13a and second external electrode 13b of each laminated block 10, and this voltage is applied to a plurality of electrostrictive material layers forming the laminated body 11 through the internal electrodes 12a and 12b, so that these electrostrictive material layers are strained. In addition, the lead wires 41 for connecting the external electrodes 13a,13b are out of the casing 20 through the windows 21a and 21b, and the lead wires 42 for supplying a voltage are out through the windows 21a and 21b. The laminated blocks 10 thus superposed constitute one unit 30 which corresponds to a conventional electrostrictive effect element.

The tension spring 50 is formed in a spiral shape having substantially circular cross-section and disposed outside the casing 20 with a suitable clearance. The tension spring 50 has a natural (unstrained) height slightly shorter than the height of the casing 20. Either ends of the spring 50 respectively are connected to circular metal end plates 61 and 62 which are respectively urged from the outside direction against the upper surface of the upper-most laminated block 10 and the lower surface of the lower-most laminated block 10. As a result, each of the laminated blocks 10 thus stacked in the casing 20 is held while a compressive force in the vertical direction by a tension force generated by the tension spring 50 is maintained.

Next, a production method of an electrostrictive effect element according to this embodiment will be explained below.

Figure 1:
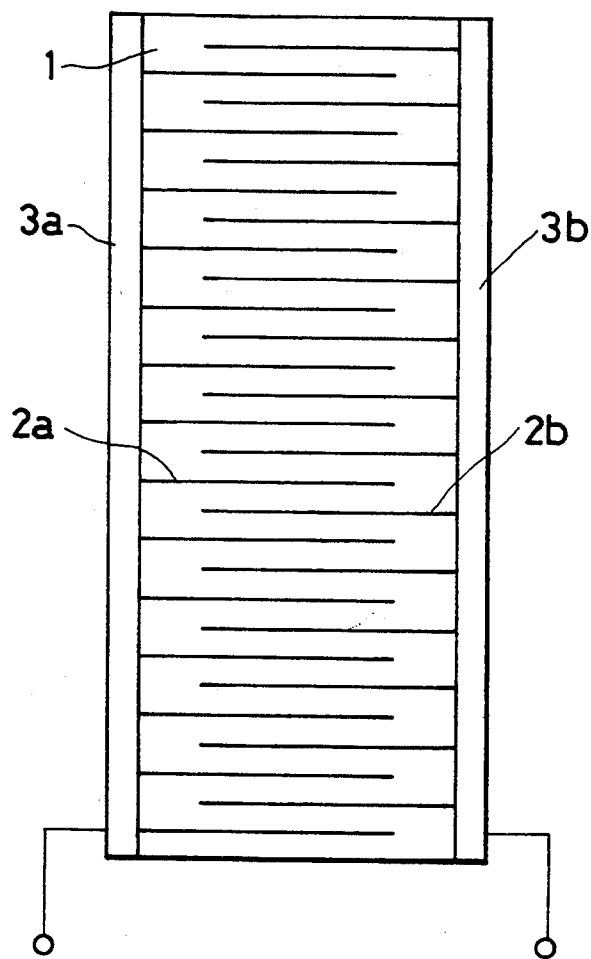
FIG. 1 is a longitudinally cross-sectional view of a conventional electrostrictive effect element.
Figure 2:
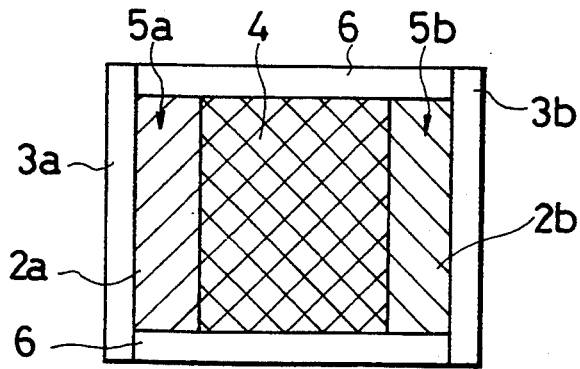
FIG. 2 is a diagram showing an arrangement, or superposing pattern, of internal electrodes of the electrostrictive effect element shown in FIG. 1.
Figure 5:
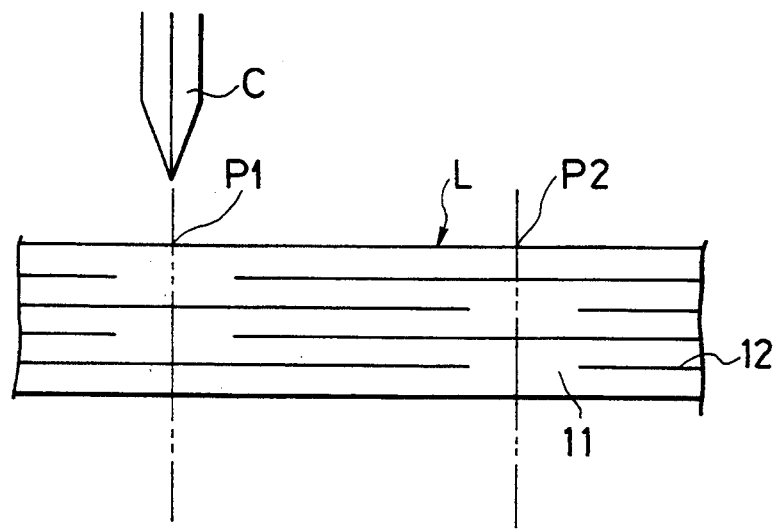
Fig. 5 is a longitudinally cross-sectional view showing a process of cutting a laminated body having laminated ceramic green sheets having internal electrodes formed in a method of producing the electrostrictive effect element shown in FIGS. 3 and 4.

First, an electrostrictive effect ceramic material, for example, of the lead titanium zirconate system, is finely powdered. The fine powder thus obtained is mixed with an organic binder, solvent and plasticizer and then, kneaded. Thereafter, a plurality of green sheets each having a thickness of about 130 microns ($\mu m$) are prepared by a doctor blade method. Next, an internal electrode 12 is formed on the surface of each of the green sheets thus prepared by a screen printing method. Several green sheets thus printed (for example, three to five sheets) are superposed and heated for thermal adhesion. Thus, as shown in FIG. 5, a plate-like laminated body L is formed which has a plurality of internal electrodes 12a and a plurality of internal electrodes 12b alternately shifted in the direction perpendicular to the direction of lamination.

Figure 6:
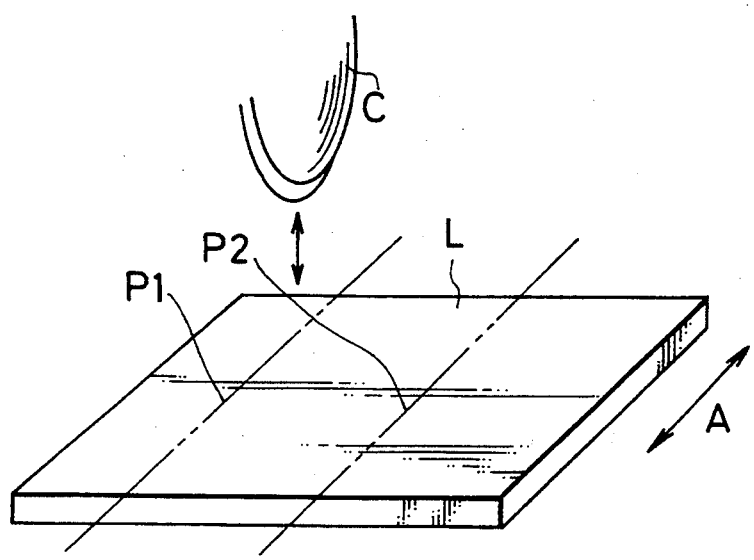
Fig. 6 is a schematic perspective view showing a process of cutting the ceramic green sheet-laminated body shown in FIG. 5.

Next, as shown in FIG. 6, the laminated body L is successively cut along the lines P1 and P2 by moving a rotating cutter edge C vertically while the plate-like laminated body L is being moved in the horizontal direction along the arrow A. Thereafter, each piece obtained by cutting the laminated body L is baked, thus obtaining a laminated body 11 as shown in FIG. 7. The laminated body 11 thus obtained is a columnar body having a cross-section shape of rectangular parallelepiped which consists of a plurality of green sheets of the above-described ceramic material having a plurality of plate-like internal electrodes 12a and a plurality of plate-like internal electrodes 12b which are disposed at a constant interval of space in the vertical direction. One end of the internal electrode 12a and one end of the internal electrode 12b are respectively exposed on the cutting surfaces, or the side surfaces 11a and 11b of the laminated body 11.

Next, a paste comprising a metal powder consisting mainly of silver, glass frit and material for providing an intimate adhesion with the above-described ceramic material sheet is applied on the side surfaces 11a and 11b and baked for forming the external electrodes 13a and 13b, respectively. Because the internal electrodes 12a and 12b respectively have their one ends exposed on the side surfaces 11a and 11b, the internal electrodes 12a and 12b are automatically connected to the external electrodes 13a and 13b, respectively. As a result, the laminated block 10 having so-called laminated ceramic capacitor structure as shown in FIG. 8 can be obtained.

On the other hand, a columnar casing 20 made of an electrically insulating resin clearly shown in FIG. 9 is prepared. The casing 20 has a cross-section of rectangular parallelepiped substantially similar to that of the laminated block 10 in order that the laminated blocks 10 can be contained thereinto in an easily fitting manner. Furthermore, in the side surfaces 20a and 20b of the casing 20 corresponding to the external electrodes 13a and 13b of the laminated blocks 10 thus contained are formed windows 21a and 21b, respectively.

Next, a plurality of laminated blocks 10 are superposingly contained in a one-by-one manner from the upper opening of the casing 20 thereinto. In this case, as shown in FIG. 9, the laminated blocks 10 are contained so that the external electrodes 13a and 13b are confronted respectively to the windows 21a and 21b of the casing 20. When to be contained thereinto, a part of each of the external electrodes 13a and 13b is exposed from the corresponding one of the windows 21a and 21b of the casing 20. Subsequently, through each of the windows 21a and 21b, one end of a thin metal lead wire 41 is connected to each of the external electrodes 13a and 13b of the laminated block 10 using an electroconductive resin or solder, and adjacent first external electrodes 13a and adjacent second external electrodes 13b respectively are connected to each other. In addition, through each of the windows 21a and 21b, one end of a lead wire 42 is connected to the corresponding one of the lower-most first and second external electrodes 13a and 13b. Thus, a unit 30 consisting of a plurality of laminated blocks 10 as shown in FIG. 10 is obtained. In addition, each laminated block 10 is merely contacted with the adjacent ones with no mechanical connection. The upper and lower ends of the unit 30 respectively are slightly protruded from the upper and lower ends of the casing 20.

Next, a spiral-shaped tension spring 50 is disposed in a fitting manner outside the casing 20 containing the unit 30 as shown above. The height of the tension spring 50 is slightly smaller than that of the unit 30. As a result, the ends of the spring 50 are joined by welding or soldering to the end plates 61 and 62, respectively, while applying a tensile force to the tension spring 50. After joining, the tensile force is ceased to be applied. The tension spring 50 is provided outside the casing 20 as shown above, so that the unit 30, or laminated blocks can be retained while being always applied with a compressive force in the vertical direction. Thus, the electrostrictive effect element as shown in FIG. 3 can be obtained.

Figure 11:
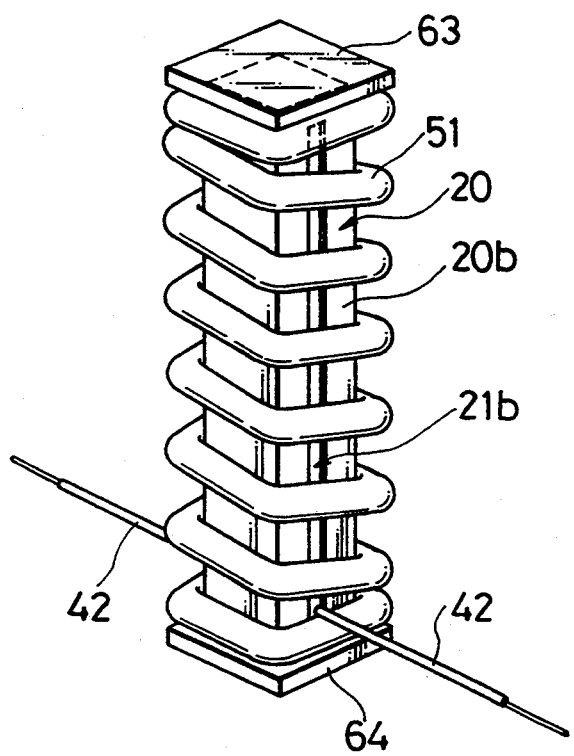
FIG. 11 is a perspective view of an electronstrictive effect element according to another embodiment of this invention.

FIG. 11 shows another embodiment of this invention, which is substantially equal in structure to the above-described embodiment and can be produced in the same method as above except a spiral-shaped tension spring 51 surroundingly provided outside a casing 20. In this embodiment, the tension spring 51 has a cross-section of rectangular parallelepiped substantially equal to that of the casing 20. As a result, an electrostrictive effect element having a better volume efficiency than that of the above-described one can be advantageously obtained. In addition, it is the matter of course that the tension spring 51 can be cross-sectionally shaped into any shape other than those of the springs 50,51.

As explained above, in an electrostrictive effect element of this invention, electrostrictive material sheets are provided in such a lamination number that the laminated body 11 of electrostrictive material is not mechanically damaged due to stress concentration developed at the boundary between an area where the internal electrodes 12a and 12b are superposingly existed and an area where the internal electrodes 12a and 13a are not existed thereby forming the laminated blocks 10 of a laminated capacitor-type structure. Then, a plurality of the laminated blocks 10 are superposingly placed in an one-by-one manner with no mechanical connection to form the unit 30. The unit 30 is retained under the application of a compression force from the length-wise direction thereof. As a result, when a voltage is applied to each laminated block 10, a stress developed at the boundary therebetween as described above can be reduced to such a level that is generated, for example, by three to five electrostrictive material layers, and yet a stress developed in each laminated block 10 is dispersed at the contact surface with an adjacent one. Consequently, with the electrostrictive effect element thus obtained, there is no concern that it is mechanically damaged as the whole, which means that a large amount of displacement can be taken out.

What is claimed is:

1. An electrostrictive effect element comprising:
    a columnar casing having first and second open ends;
    a plurality of laminated ceramic capacitor structures contained in said casing, said structures being stacked and aligned along a longitudinal axis of said casing with no mechanical connection but with an electrical connection to each other, each of said structures including electrostrictive material layers laminated along said longitudinal axis of said casing;

a pair of engaging members placed at said first and second ends of said casing, respectively, one of said pair of members being engaged with a first one of said stacked structures and the other thereof being engaged with a last one of said stacked structures; and compression means for applying a compressive force to said stacked structures along said longitudinal axis of said casing, said compression means being placed outside of said casing, wherein under application of a predetermined voltage and due to small number of laminations of said layers, said laminated electrostrictive material layers of each of said structures are not damaged and adjacent ones of said laminated ceramic capacitor structures are displaceable at contact surfaces thereof.

2. An electrostrictive effect element as claimed in claim 1, wherein each of said plurality of laminated ceramic capacitor structures comprises:

a laminated body formed by said electrostrictive material layers laminated along said longitudinal axis of said casing;

a plurality of first internal electrodes along said longitudinal axis of said casing at spaced intervals in said laminated body;

a plurality of second internal electrodes along said longitudinal axis of said casing at spaced intervals in said laminated body;

each of said first internal electrodes and each of said second internal electrodes being alternately disposed;

a first external electrode disposed on a first side of said laminated body along said longitudinal direction of said casing, said first external electrode being electrically connected to said plurality of first internal electrodes; and a second external electrode disposed on a second side of said laminated body along said longitudinal direction of said casing, said second external electrode being electrically connected to said plurality of second internal electrodes.

3. An electrostrictive effect element as claimed in claim 2, wherein said casing has a cross-sectional shape substantially equal to that of each of said laminated ceramic capacitor structures, said casing having windows at side faces thereof opposing said first and second external electrodes, respectively.

4. An electrostrictive effect element as claimed in claim 3, wherein said casing is made of an electrically insulating resin.

5. An electrostrictive effect element as claimed in claim 3, wherein said first external electrodes of said plurality of laminated ceramic capacitor structures are electrically connected to each other using one of said windows, and said second external electrodes thereof re electrically connected to each other using another of said windows.

6. An electrostrictive effect element as claimed in claim 1, wherein said compression means includes a tension spring having a cross-sectional shape similar to said casing.

7. An electrostrictive effect element as claimed in claim 1, wherein said compression means includes an elastic fabric material.

8. An electrostrictive effect element comprising:

a columnar casing having first and second open ends;

a plurality of laminated ceramic capacitor structures contained in said casing, said structures being stacked and aligned along a longitudinal axis of said casing with no mechanical connection but with an electrical connection to each other, each of said structures including electrostrictive material layers laminated along said longitudinal axis of said casing;

a pair of engaging members placed at said first and second ends of said casing, respectively, one of said pair of members being engaged with a first one of said stacked structures and the other thereof being engaged with a last one of said stacked structures; and a spiral-shaped tension spring for applying a compressive force to said stacked structures along said longitudinal axis of said casing, said spring being placed outside of said casing, wherein under application of a predetermined voltage and due to small number of laminations of said layers, said laminated electrostrictive material layers of each of said structures are not damaged, and adjacent ones of said laminated ceramic capacitor structures are displaceable at contact surfaces thereof.

9. An electrostrictive effect element comprising:

a columnar casing having first and second open ends;

a plurality of laminated ceramic capacitor structures contained in said casing, said structures being stacked and aligned along a longitudinal axis of said casing with no mechanical connection but with an electrical connection between each other, each of said structures including electrostrictive material layers laminated along said longitudinal axis of said casing;

a pair of rigid members placed at said first and second ends of said casing, respectively, one of said pair of members being joined with a first one of said stacked structure and the other thereof being joined with a last one of said stacked structures; and compression means for applying a compressive force to said stacked structures along said longitudinal axis of said casing, said compression means being placed outside of said casing, wherein under application of a predetermined voltage and due to small number of laminations of said layers, said laminated electrostrictive material layers of each of said structures are not damaged, and adjacent ones of said laminated ceramic capacitor structures are displaceable at contact surfaces thereof.

* * * * *